United States Patent
Kim (10) Patent No.: US 7,426,254 B2
(45) Date of Patent: Sep. 16, 2008

(54) SHIFT REGISTER COMPRISING ELECTRICAL FUSE AND RELATED METHOD

(75) Inventor: Jin-Hyun Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/723,360

(22) Filed: Mar. 19, 2007

(65) Prior Publication Data

US 2008/0043898 A1 Feb. 21, 2008

(30) Foreign Application Priority Data

Aug. 18, 2006 (KR) .................. 10-2006-0077969

(51) Int. Cl.
*G11C 19/00* (2006.01)
*G11C 7/00* (2006.01)

(52) U.S. Cl. .................. 377/75; 377/69; 377/64; 365/200; 365/225.7; 365/225.6

(58) Field of Classification Search ............ 377/75, 377/69, 64; 365/200, 225.6, 225.7
See application file for complete search history.

(56) References Cited

U.S. PATENT DOCUMENTS

| | | | |
|---|---|---|---|
| 5,677,917 A | | 10/1997 | Wheelus et al. |
| RE35,797 E | * | 5/1998 | Graham et al. ............ 326/40 |
| 5,941,974 A | * | 8/1999 | Babin ..................... 710/316 |
| 6,418,182 B1 | * | 7/2002 | Suyama et al. ........... 377/69 |
| 6,426,911 B1 | | 7/2002 | Lehmann et al. |
| 6,577,553 B2 | * | 6/2003 | Makabe et al. ........ 365/230.06 |
| 2005/0201165 A1 | | 9/2005 | Ashizawa |
| 2005/0276369 A1 | * | 12/2005 | Mutaguchi ............. 377/64 |

* cited by examiner

*Primary Examiner*—Vibol Tan
(74) *Attorney, Agent, or Firm*—Volentine & Whitt, PLLC (57) ABSTRACT

A shift register including an electrical fuse and a method of operating the shift register are disclosed. The shift register includes a register flip-flop group circuit and a plurality of output circuits respectively receiving a plurality of enable signals. Each output circuit includes a fuse control flip-flop receiving one of the plurality of enable signals and outputting a fuse control signal in response to the one enable signal. Each output circuit also includes an electrical fuse receiving the fuse control signal and outputting an electrical fuse mode signal, and a multiplexer outputting either the register output signal or the electrical fuse mode signal as a final output signal in accordance with the one enable signal.

18 Claims, 11 Drawing Sheets

SHIFT REGISTER COMPRISING ELECTRICAL FUSE AND RELATED METHOD

BACKGROUND OF THE INVENTION

1. Field of the Invention

Embodiments of the invention relate to a shift register. In particular, embodiments of the invention relate to a shift register comprising an electrical fuse and a related method for operating the shift register.

This application claims priority to Korean Patent Application 10-2006-0077969, filed on Aug. 18, 2006, the subject matter of which is hereby incorporated by reference in its entirety.

2. Description of the Related Art

Figure 1:
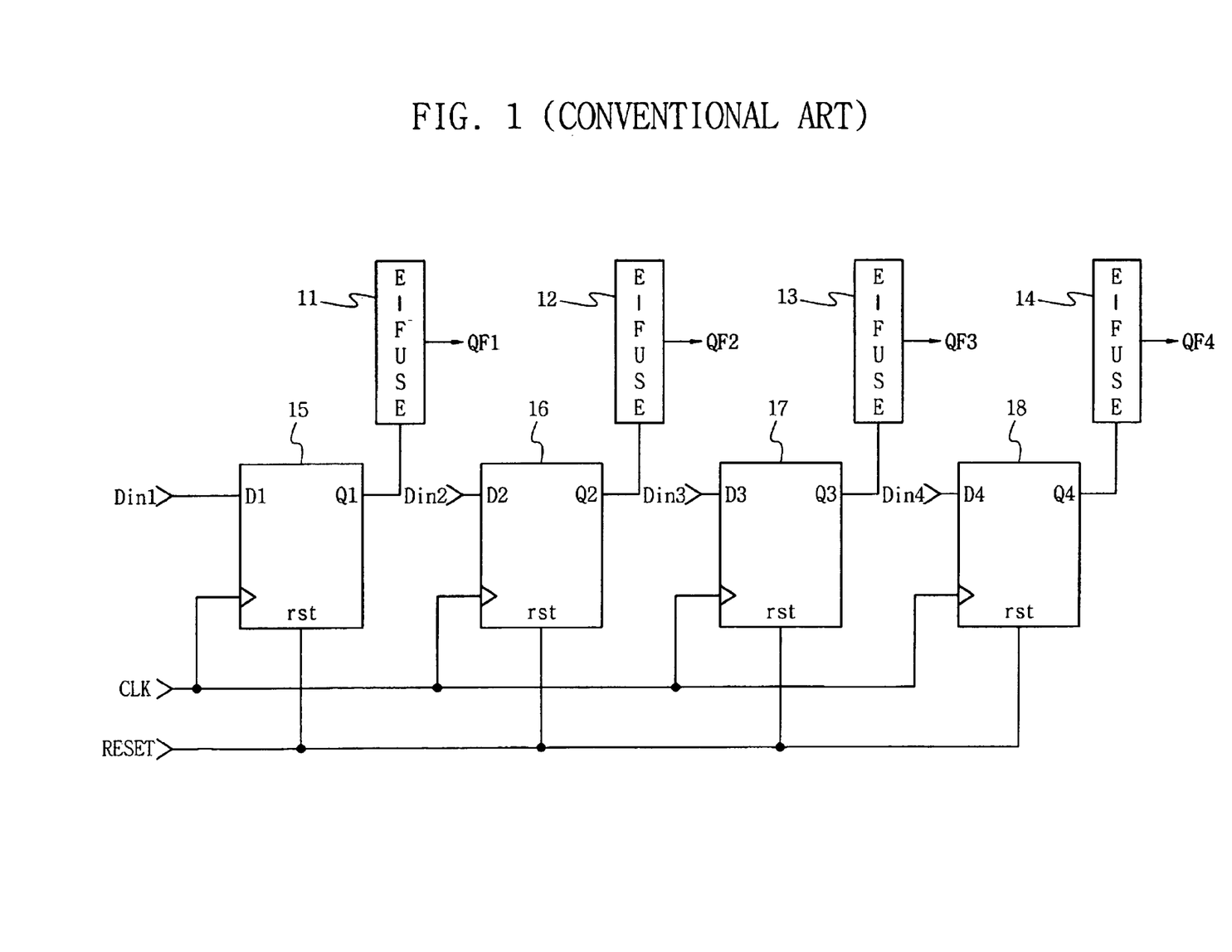
FIG. 1 is a block diagram of a conventional parallel register comprising electrical fuses.

FIG. (FIG.) 1 illustrates a configuration of a conventional parallel register comprising electrical fuses. In particular, FIG. 1 illustrates four register D flip-flops 15, 16, 17, and 18, and electrical fuses 11, 12, 13, and 14 (each of which is also labeled "E-FUSE" in FIG. 1), which correspond to register D flip-flops 15, 16, 17, and 18, respectively. Although four D flip-flops and four corresponding electrical fuses are shown as an example in FIG. 1 for convenience of description, a conventional parallel circuit may comprise a greater number of D flip-flops and corresponding electrical fuses.

D flip-flops 15, 16, 17, and 18 receive input data D1, D2, D3, and D4, respectively, and then output the data to their respective output terminals Q1, Q2, Q3, and Q4 in response to a clock signal CLK. Each of D flip-flops 15, 16, 17, and 18 may further include a reset terminal rst for receiving a reset signal RESET. D flip-flops are well-known to those skilled in the art, so a detailed description thereof will be omitted here.

Input data signals Din1, Din2, Din3, and Din4 are applied to the input terminals of D flip-flops 15, 16, 17, and 18, respectively, and output through output terminals of D flip-flops 15, 16, 17 and 18, respectively, in response to a clock signal CLK. Electrical fuses 11, 12, 13, and 14 are selectively cut in accordance with input data signals Din1, Din2, Din3, and Din4 applied to and received from D flip-flops 15, 16, 17, and 18, respectively, and electrical fuses 11, 12, 13, and 14 generate final output signals QF1, QF2, QF3, and QF4, respectively.

It will be assumed that, for each of electrical fuses 11, 12, 13, and 14, when the electrical fuse receives a signal having a logic high level, the electrical fuse is cut and latches a signal having a logic high level. Thus, when input data signals D1, D2, D3, and D4 have a logic levels of low, low, low, and high, respectively, final output signals QF1, QF2, QF3, and QF4 are set to logic levels of low, low, low, and high, respectively.

However, the parallel register comprising electrical fuses shown in FIG. 1 needs an additional register (not shown) for the input data. That is, an additional register is needed to set input data signals D1, D2, D3, and D4 to have logic levels of, for example, low, low, low, and high, respectively. Although the disadvantage of requiring the additional register may not be very great if there are only four input data signals, as shown in FIG. 1, if many more input data signals are needed, it may be difficult to arrange all of the pads that may be needed for the input data signals, and the additional register may occupy a relatively large layout area.

Also, in addition to the parallel register comprising the electrical fuses, an additional parallel register used for a test mode is needed, so the parallel register may require an even larger layout area.

Figure 2:
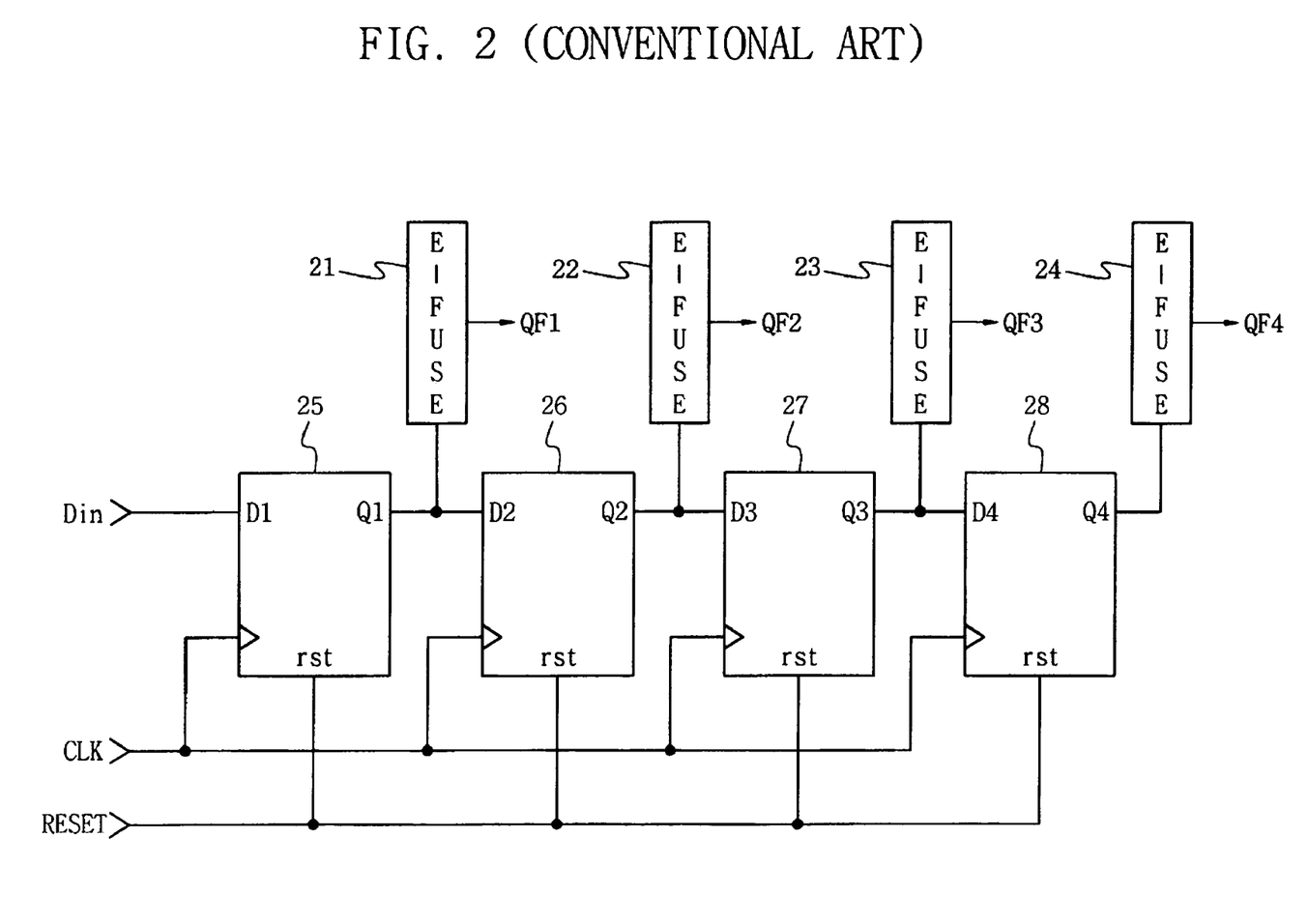
FIG. 2 is a block diagram of a conventional shift register comprising electrical fuses.

FIG. 2 illustrates a configuration of a conventional shift register comprising electrical fuses, wherein the shift register, unlike the parallel register of FIG. 1, does not require an additional parallel register for input data.

Referring to FIG. 2, the shift register of FIG. 2 comprises four register D flip-flops 25, 26, 27, and 28, and four corresponding electrical fuses 21, 22, 23, and 24. Each of electrical fuses 21, 22, 23, and 24 is also labeled "E-FUSE" in FIG. 2. As with the conventional parallel register of FIG. 1, although four D flip-flops and four corresponding electrical fuses are shown as an example in FIG. 2 for convenience of description, a conventional shift register may comprise a greater number of D flip-flops and corresponding electrical fuses.

D flip fops 25, 26, 27, and 28 receive data input through input terminals D1, D2, D3, and D4, respectively. In addition, D flip fops 25, 26, 27, and 28 output the received data through output terminals Q1, Q2, Q3, and Q4, respectively, in response to a clock signal CLK. D flip-flops 25, 26, 27, and 28 are connected to one another in series in such a way that a signal output by D flip-flop 25 is input to D flip-flop 26, a signal output by D flip-flop 26 is input to D flip-flop 27, and a signal output by D flip-flop 27 is input to D flip-flop 28. D flip-flops 25, 26, 27, and 28 receive input data (i.e., D flip-flop 25 initially receives input data signal Din) and then collectively shift the data in D flip-flops 25, 26, 27, and 28 in response to clock signal CLK. D flip-flops 25, 26, 27, and 28 may further include a reset terminal rst for receiving a reset signal RESET. D flip-flops are well-known to those skilled in the art, so a detailed description thereof will be omitted here.

Electrical fuse 21 is selectively cut in accordance with an output signal of D flip-flop 25, which corresponds to a signal (Din) previously input through input terminal D1 of D flip-flop 25. Likewise, electrical fuse 22 is selectively cut in accordance with an output signal of D flip-flop 26, which corresponds to a signal previously input through input terminal D2 of D flip-flop 26, electrical fuse 23 is selectively cut in accordance with an output signal of D flip-flop 27, which corresponds to a signal previously input through input terminal D3 of D flip-flop 27, and electrical fuse 24 is selectively cut in accordance with an output signal of D flip-flop 28, which corresponds to a signal previously input through input terminal D4 of D flip-flop 28. In addition, electrical fuses 21, 22, 23, and 24 output final output signals QF1, QF2, QF3, and QF4 during an operating cycle (i.e., a cycle of a clock signal CLK) during which the output signal of D flip-flop 28, which is applied to electrical fuse 24, has the first data value input through data signal Din.

It will be assumed that, for each of electrical fuses 21, 22, 23, and 24, when the electrical fuse receives a signal having a logic high level, the electrical fuse is cut and latches a signal having a logic high level. When, at relevant times of four sequential operating cycles corresponding to clock signal CLK (see FIG. 3), data input signal Din applied to an input terminal D1 of D flip-flop 25 has logic levels of high, low, low, and low, respectively, final output signals QF1, QF2, QF3, and QF4 of electrical fuses 21, 22, 23, and 24, respectively, will have logic levels of low, low, low, and high, respectively, during the fourth of those four sequential operating cycles.

Consequently, only electrical fuse 24 is cut (electrical fuses 21, 22, and 23 are not cut), so final output signals QF1, QF2, QF3, and QF4 are fixed having logic levels of low, low, low, and high, respectively. That is, a set of the final output signals of the shift register of FIG. 3 is fixed having logic levels of low, low, low, and high.

Figure 3:
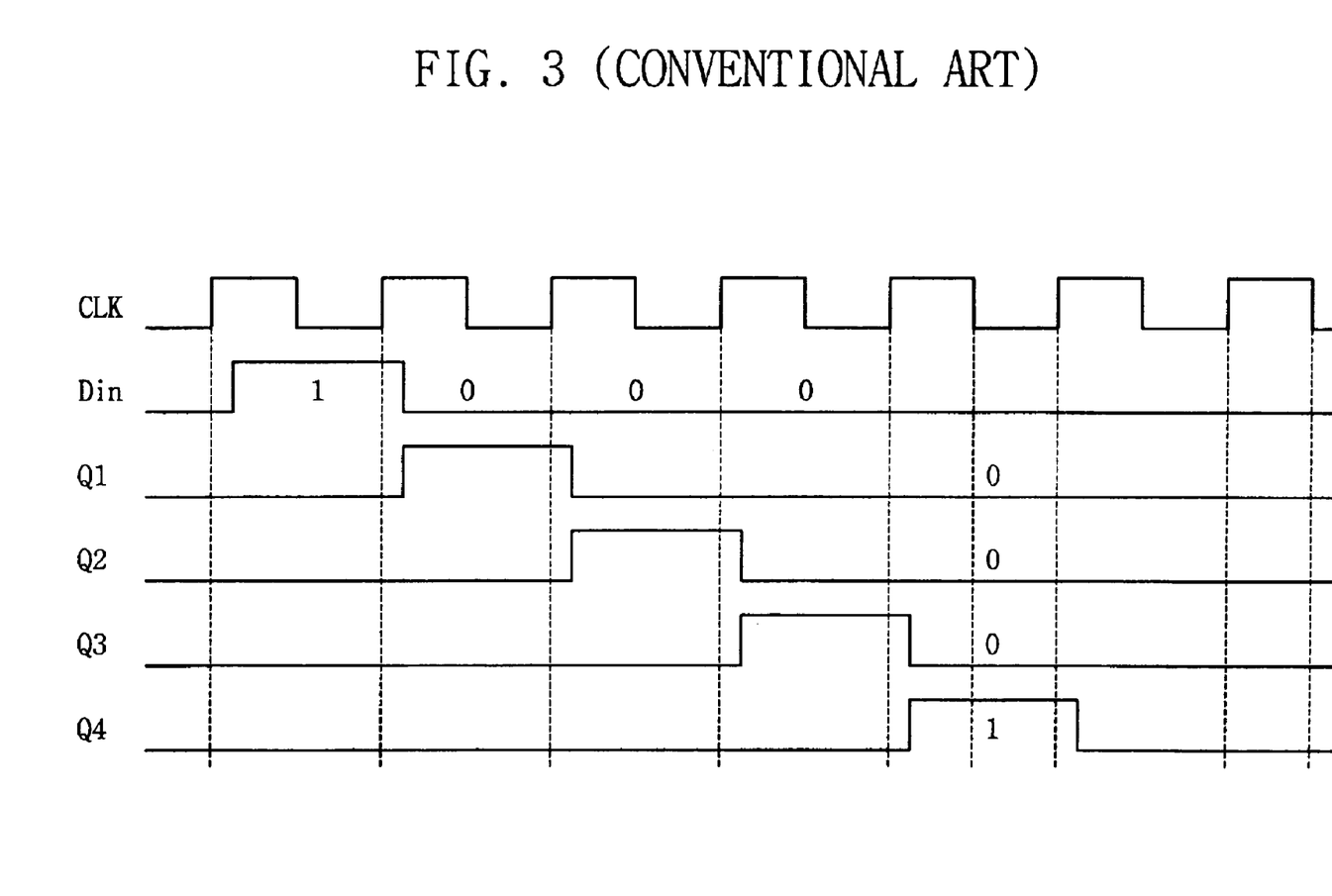
FIG. 3 is a timing diagram illustrating an operation of the shift register illustrated in FIG. 2.

FIG. 3 is a timing diagram illustrating an operation of the shift register illustrated in FIG. 2. An exemplary operation of the shift register illustrated in FIG. 2 will now be described with reference to FIG. 3. After the first data value of input data signal Din (i.e., 1 in FIG. 3) input to D flip-flop 25 has been output by D flip-flop 28, electrical fuses 21, 22, 23, and 24 of FIG. 2 latch the data values 0 (i.e., a logic low level), 0, 0, and 1 (i.e., a logic high level), respectively. Thus, final output signals QF1, QF2, QF3, and QF4 have data values of 0, 0, 0, and 1, respectively, and final output signals QF1, QF2, QF3, and QF4 form a final output signal set for the shift register of FIG. 2.

A final output signal set for the shift register may be used for a mode register set (MRS), for example, or for another use.

A benefit of the shift register comprising electrical fuses described with reference to FIGS. 2 and 3 is that the shift register does not require an additional register in order to perform an operation that results in the electrical fuses outputting a final output signal set having, for example, logic levels of low, low, low, and high. However, to perform such an operation in the parallel register of FIG. 1, an additional register is needed in order to set input data signals Din1, Din2, Din3, and Din4 to logic levels of low, low, low, and high, respectively. However, in the shift register of FIG. 2, an error may occur in which an electrical fuse is cut during a operating cycle during which it was not supposed to be cut (i.e., during an unexpected operating cycle), which may produce an error in the final output signal set.

For example, referring to FIGS. 2 and 3, although a signal output by output terminal Q1 of D flip-flop 25 has a logic high level for only one operating cycle of clock signal CLK, the logic high level output by output terminal Q1 of D flip-flop 25 may affect electrical fuse 21, so electrical fuse 21 may be cut. A similar problem exists with respect to electrical fuses 22 and 23 of FIG. 2. Therefore, the shift register illustrated in FIG. 2 may not be reliable.

The conventional parallel register comprising electrical fuses has a relatively large layout area, and the conventional shift register comprising electrical fuses may output an erroneous final output signal set. Thus, an improved register solving both of the above problems is required.

SUMMARY OF THE INVENTION

Embodiments of the invention provide a shift register that does not require an additional register for an input data, so the layout area of the shift register may be smaller than the layout area of a conventional parallel register comprising an electrical fuse. Embodiments of the invention also provide a shift register and a method for operating the shift register, wherein the shift register has a smaller layout area than a conventional parallel register that comprises an electrical fuse and an additional parallel register for use in a test mode. In addition, the shift register may reduce the amount of errors that occur in a final output signal set as a result of an electrical fuse being cut during a clock cycle in which the fuse should not be cut relative to a conventional shift register comprising an electrical fuse.

In one embodiment, the invention provides a shift register comprising a register flip-flop group circuit comprising a series connected plurality of register flip-flops, wherein the register flip-flop group circuit receives input data and shifts the input data in response to a clock signal. The shift register further comprises a plurality of output circuits adapted to respectively receive a plurality of enable signals. Each output circuit comprises a fuse control flip-flop receiving a register output signal and one of the plurality of enable signals, wherein the register output signal is output by one of the plurality of register flip-flops and the fuse control flip-flop outputs a fuse control signal in response to the one enable signal. Each output circuit further comprises an electrical fuse receiving the fuse control signal and outputting an electrical fuse mode signal, and a multiplexer receiving the register output signal, the electrical fuse mode signal, and the one enable signal, wherein the multiplexer outputs either the register output signal or the electrical fuse mode signal as a final output signal in accordance with the one enable signal.

In another embodiment, the invention provides a shift register adapted to operate in a test mode and an electrical fuse mode. The shift register comprises a register flip-flop group circuit comprising a series connected plurality of register flip-flops, wherein the register flip-flop group circuit receives input data and shifts the input data in response to a clock signal. The shift register further comprises a plurality of output circuits adapted to respectively receive a plurality of enable signals. Each output circuit comprises an electrical fuse outputting an electrical fuse mode signal, and a multiplexer receiving a register output signal, the electrical fuse mode signal, and one of the plurality of enable signals. In addition, the register output signal is output by one of the plurality of register flip-flops, the multiplexer outputs the register output signal as a final output signal in the test mode, and the multiplexer outputs one of the register output signal and the electrical fuse mode signal as the final output signal in response to the one enable signal in the electrical fuse mode.

In another embodiment, the invention provides a shift register comprising a register flip-flop group circuit comprising a plurality of series connected register flip-flops, wherein the register flip-flop group circuit receives input data and shifts the input data in response to a clock signal. The shift register further comprises a plurality of output circuits, wherein each output circuit receives an enable signal, and wherein the enable signal is the same for each output circuit. Each output circuit comprises a logic operation unit receiving the enable signal and a register output signal, wherein the register output signal is output by one of the plurality of register flip-flops and the logic operation unit performs a logic operation and outputs a logic operation result signal. Each output circuit further comprises a fuse control flip-flop receiving the logic operation result signal and outputting a fuse control signal in response to the enable signal; an electrical fuse receiving the fuse control signal and outputting an electrical fuse mode signal, wherein the electrical fuse is selectively cut in response to the fuse control signal; and a multiplexer receiving the register output signal, the electrical fuse mode signal, and the fuse control signal, and outputting either the register output signal or the electrical fuse mode signal as the final output signal in response to the fuse control signal.

In another embodiment, the invention provides a shift register adapted to operate in a test mode and an electrical fuse mode. The shift register comprises a register flip-flop group circuit comprising a plurality of series connected register flip-flops, wherein the register flip-flop group circuit receives input data and shifts the input data in response to a clock signal. The shift register further comprises a plurality of output circuits, wherein each output circuit receives an enable signal and wherein the enable signal is the same for each output circuit. Each output circuit comprises an electrical fuse outputting an electrical fuse mode signal, and a multiplexer receiving a register output signal, the electrical fuse mode signal, and a fuse control signal. In addition, the register output signal is output by one of the plurality of register flip-flops, the multiplexer outputs the register output signal as a final output signal in the test mode, and one of the register output signal and the electrical fuse mode signal as the final output signal in response to the fuse control signal in the electrical fuse mode.

In another embodiment, the invention provides a method for operating a shift register. The shift register comprises a register flip-flop group circuit comprising a plurality of series connected register flip-flops, wherein the register flip-flop group circuit receives input data and shifts the input data in response to a clock signal; and a plurality of output circuits, wherein each output circuit receives an enable signal, and wherein the enable signal is the same for each output circuit. The method comprises performing a logic operation on the enable signal and a register output signal output by one of the register flip-flops, outputting a logic operation result signal corresponding to the logic operation, outputting a fuse control signal in response to the enable signal, selectively cutting an electrical fuse in response to the fuse control signal, outputting an electrical fuse mode signal, and outputting the register output signal or the electrical fuse mode signal as a final output signal in response to the fuse control signal.

BRIEF DESCRIPTION OF THE DRAWINGS

Embodiments of the invention will be described herein with reference to the accompanying drawings, in which.

DESCRIPTION OF EMBODIMENTS

In the drawings, like reference symbols indicate like or similar elements throughout.

Figure 4:
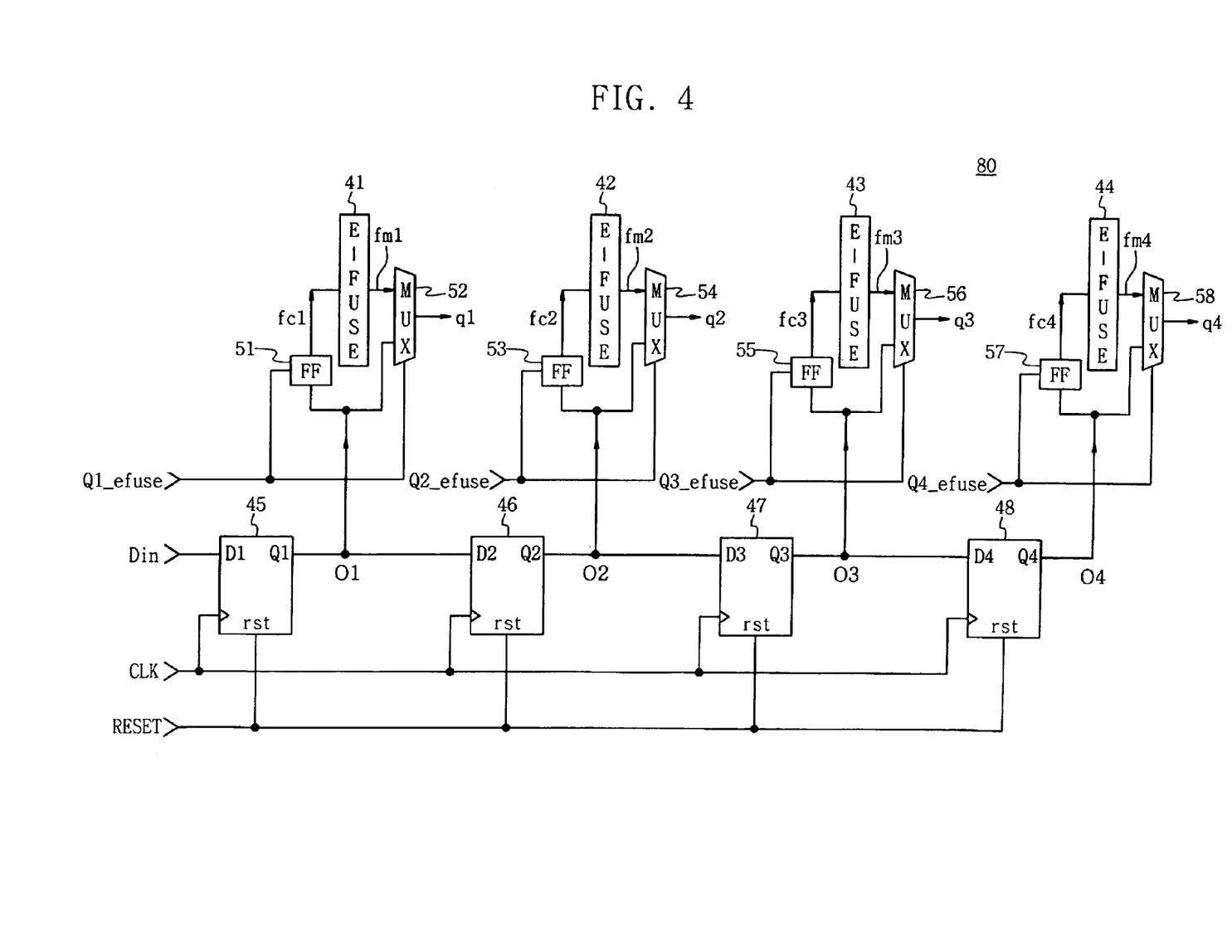
FIG. 4 is a block diagram of shift register comprising an electrical fuse in accordance with an embodiment of the invention.
Figure 5:
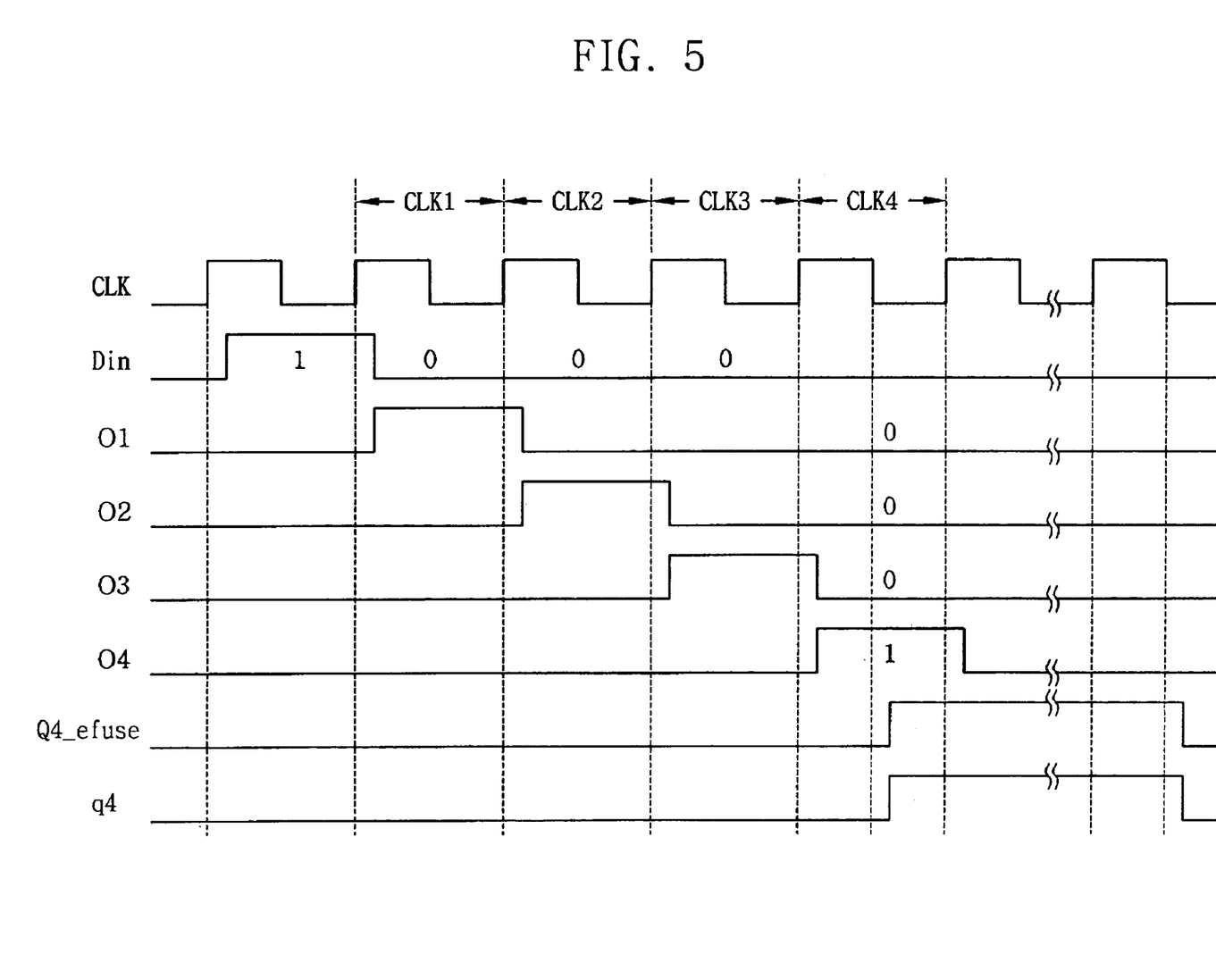
FIG. 5 is a timing diagram illustrating an operation of the shift register illustrated in FIG. 4.

FIG. 4 is a block diagram of shift register comprising an electrical fuse in accordance with an embodiment of the invention. FIG. 5 is a timing diagram illustrating an operation of the shift register illustrated in FIG. 4.

Referring to FIG. 4, a shift register 80 comprises a register flip-flop group circuit comprising a plurality of register flip-flops 45, 46, 47, and 48 connected to one another in series. The register flip-flops group circuit receives input data signal Din (i.e., register flip-flop 45 receives input data signal Din) and then shifts the data in the register flip-flop group circuit in response to a clock signal CLK (i.e., register flip-flops 45, 46, 47, and 48 collectively shift the data). Shift register 80 further comprises a plurality of fuse control flip-flops 51, 53, 55, and 57 (each of which is also marked "FF" in the drawings); a plurality of electrical fuses 41, 42, 43, and 44 (each of which is also marked "E-FUSE" in the drawings); and a plurality of multiplexers 52, 54, 56, and 58 (each of which is also marked "MUX" in the drawings). In addition, the fuse control flip-flops, electrical fuses, and multiplexers may be grouped into output circuits such that each output circuit comprises one of the fuse control flip-flops, one of the electrical fuses, and one of the multiplexers, and each output circuit corresponds to one of the register flip-flops. For example, a first output circuit corresponding to register flip-flop 45 comprises fuse control flip-flop 51, electrical fuse 41, and multiplexer 52. Second through fourth output circuits corresponding to register flip-flops 46, 47, and 48, respectively, are analogous to the first output circuit. In addition, first through fourth output circuits receive enable signals Q1_efuse, Q2_efuse, Q3_efuse, and Q4_efuse, respectively.

Each of register flip-flops 45, 46, 47, and 48 is a D flip-flop, may have a reset terminal rst that receives a reset signal RESET, and is reset by reset signal RESET In addition, each of fuse control flip-flops 51, 53, 55, and 57 is a D flip-flop. D flip-flops are well-known to those skilled in the art, so a detailed description thereof will be omitted here.

Shift register 80 may be described as comprising a register flip-flop group circuit comprising four register flip-flops (i.e., register flip-flops 45, 46, 47, and 48), and comprising four output circuits, wherein the first through fourth output circuits correspond to register flip-flops 45, 46, 47, and 48, respectively. The configuration and operation of the first output circuit and its corresponding register flip-flop (register flip-flop 45) is substantially the same as the configuration and operation of any of the other output circuits and its corresponding register flip-flop. So, for clarity of brevity of explanation, the configuration and operation of only the first output circuit and its corresponding register flip-flop (e.g., register flip-flop 45) will be described in detail.

As mentioned above, the first output circuit of shift register 80 corresponds to register flip-flop 45 of shift register 80, and the first output circuit comprises fuse control flip-flop 51, electrical fuse 41, and multiplexer 52. Fuse control flip-flop 51 receives a register output signal output by register flip-flop 45 and is controlled in accordance with an enable signal Q1_efuse corresponding to register flip-flop 45. In addition, fuse control flip-flop 51 outputs a fuse control signal fc1 corresponding to register flip-flop 45. Electrical fuse 41 receives fuse control signal fc1 from fuse control flip-flop 51 and generates an electrical fuse mode signal fm1 corresponding to register flip-flop 45.

Figure 8:
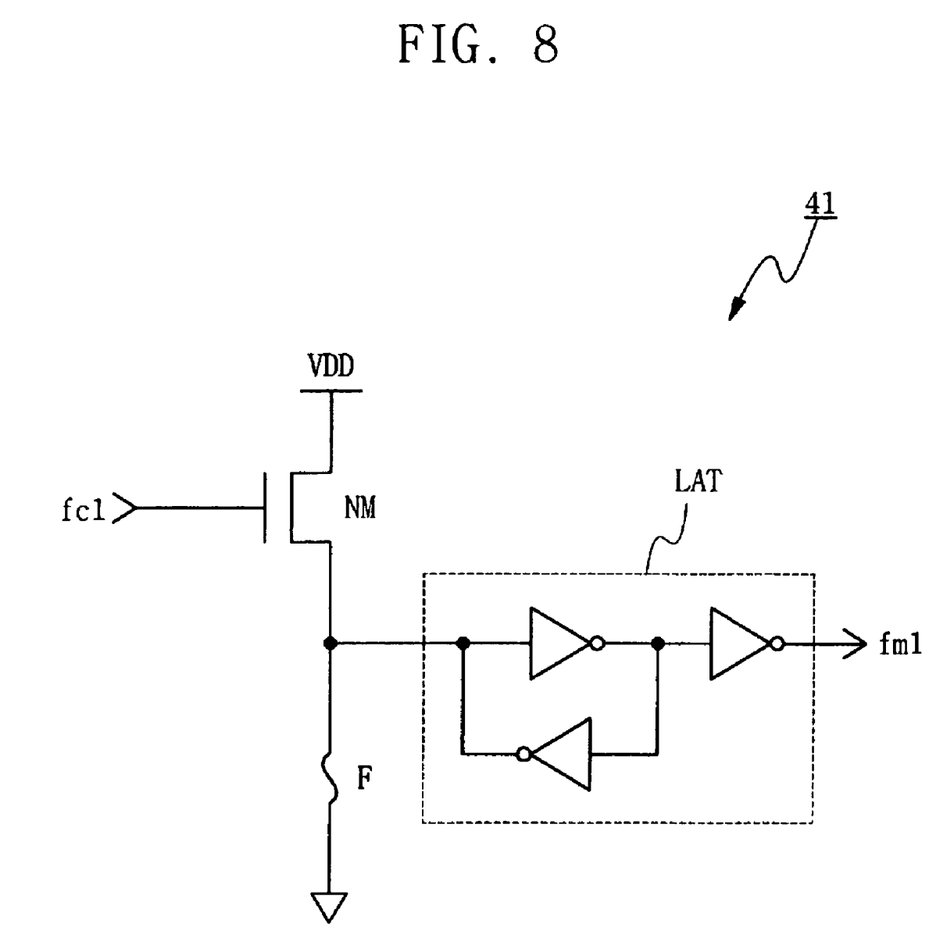
FIG. 8 is a circuit diagram illustrating an electrical fuse of FIG. 4 in accordance with an embodiment of the invention.

FIG. 8 is a circuit diagram illustrating an embodiment of electrical fuse 41 of FIG. 4. Referring to FIG. 8, electrical fuse 41 comprises an N-type Metal Oxide Semiconductor (NMOS) transistor NM comprising a gate adapted to receive fuse control signal fc1, a drain receiving a power source voltage VDD, and a source that is grounded. In addition, a fuse F is electrically connected between the source of NMOS transistor NM and a ground terminal, and a latch LAT is electrically connected between the source of NMOS transistor NM and an output terminal of electrical fuse 41. Also in electrical fuse 41, a fuse control signal fc1 is applied to a gate of NMOS transistor NM, and a latch LAT outputs an electric fuse mode signal fm1. Respective embodiments of electrical fuses 42, 43, and 44 of FIG. 4 may each be substantially the same as the embodiment of electrical fuse 41 illustrated in FIG. 8.

Referring to FIG. 4, multiplexer 52 is adapted to receive the register output signal output by register flip-flop 45 and electrical fuse mode signal fm1 and is adapted to output (i.e., generate) a final output signal q1. That is, multiplexer 52 is controlled in accordance with enable signal Q1_efuse to output as final output signal q1 either the register output signal of register flip-flop 45 (i.e., a test mode signal) or electrical fuse mode signal fm1. For example, when enable signal Q1_efuse has a logic high level, multiplexer 52 outputs electrical fuse mode signal fm1 as final output signal q1. However, when enable signal Q1_efuse has a logic low level, multiplexer 52 outputs a signal apparent on output node O1 corresponding to register flip-flop 45 (i.e., the register output signal output by register flip-flop 45) as final output signal q1.

An exemplary operation of shift register 80 of FIG. 4 will now be described with reference to FIGS. 4 and 5. In the operation illustrated in FIG. 5, four data values are sequentially input to register flip-flop 45 through input data signal Din. That is, data values 1 (i.e., a logic high level), 0 (i.e., a logic low level), 0, and 0 are sequentially input to register flip-flop 45 through input data signal Din. The register flip-flop group circuit shifts the data input through input data signal Din, so, when the data value 1 that was initially input is apparent at an output node O4, 0's will be apparent at each of output nodes O1, O2, and O3.

Referring to FIGS. 4 and 5, register flip-flop 45 receives and latches input data signal Din and then outputs the latched data to an output terminal Q1 of register flip-flop 45 in response to a first operation cycle CLK1 of clock signal CLK. Output node O1 is connected (i.e., coupled) to output terminal Q1 and an input terminal D2 of register flip-flop 46, and a signal apparent at output node O1 is applied to input terminal D2 of register flip-flop 46 and latched in register flip-flop 46. Data latched in register flip-flop 46 is then output to an output terminal Q2 of register flip-flop 46 in response to a second operating cycle CLK2 of clock signal CLK. Register flip-flop 47 latches data output by register flip-flop 46 and then outputs the latched data in response to a third operating cycle CLK3 of clock signal CLK. Register flip-flop 48 latches data output by register flip-flop 47 and then outputs the latched data in response to a fourth operating cycle CLK4 of clock signal CLK. Operating cycles CLK1 through CLK4 correspond to consecutive cycles of clock signal CLK. Though the shifting of one data value through each of register flip-flops 45, 46, 47, and 48 was described above, register flip-flops 45, 46, 47, and 48 may collectively shift multiple data values at the same time through the simultaneous operation of register flip-flops 45, 46, 47, and 48 in accordance with clock signal CLK.

Because register flip-flops 45, 46, 47, and 48 may collectively shift multiple data values at the same time, and because of the data values input through input data signal Din, during a fourth operating cycle CLK4, a signal having logic low level is apparent at each of output nodes O1, O2, and O3, and a signal having a logic high level is apparent at output node O4. Thus, during the fourth operating cycle CLK4, when enable signal Q4_efuse having a logic high level is provided to multiplexer 58 corresponding to fuse control flip-flop 57, multiplexer 58 outputs output signal q4 having a logic high level.

Consequently, when the data shift is completed by register flip-flops 45, 46, 47, and 48, and then enable signal Q4_efuse corresponding to electrical fuse 44 is set to a logic high level for a given amount of time, the data values of a final output signal set comprising final output signals q1, q2, q3, and q4 are set.

Figure 9:
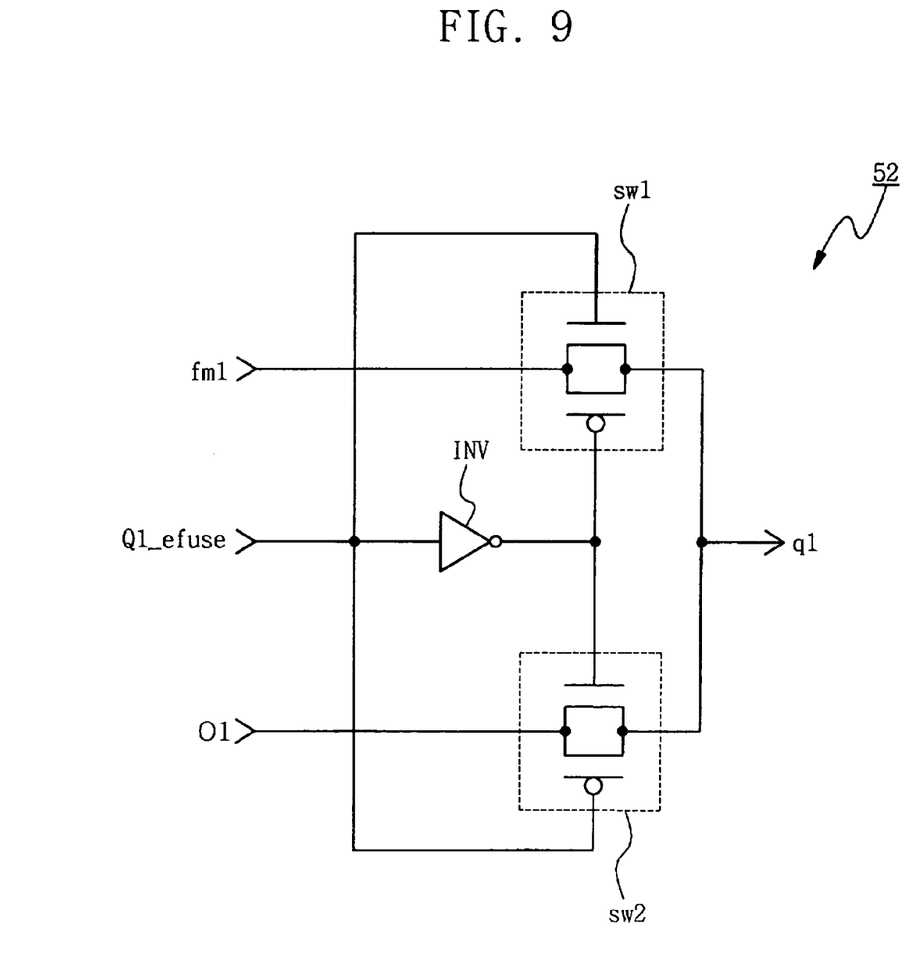
FIG. 9 is a circuit diagram illustrating a multiplexer of FIG. 4 in accordance with an embodiment of the invention.

FIG. 9 is a circuit diagram illustrating multiplexer 52 of FIG. 4 in accordance with an embodiment of the invention. Exemplary operations of multiplexer 52 will now be described with reference to FIG. 9.

Referring to FIG. 9, electrical fuse mode signal fm1, a signal apparent at node O1 (i.e., a register output signal output by register flip-flop 45), and enable signal Q1_efuse are input to multiplexer 52, and multiplexer 52 outputs final output signal q1. When, for example, enable signal Q1_efuse has a logic high level, electrical fuse mode signal fm1 is output as final output signal q1. That is, when enable signal Q1_efuse has a logic high level, a switching transistor sw1 is turned ON and multiplexer 52 outputs electrical fuse mode signal fm1 as final output signal q1. However, when enable signal Q1_efuse has a logic low level, the signal apparent at output node O1 is output as final output signal q1. That is, when enable signal Q1_efuse has a logic low level, a switching transistor sw2 is turned ON and multiplexer 52 outputs the signal apparent at output node O1 as final output signal q1. Respective embodiments of multiplexers 54, 56, and 58 of FIG. 4 may each be substantially the same as the embodiment of multiplexer 52 illustrated in FIG. 9. However, the structure and operation of multiplexer 52 described above with reference to FIG. 9 is merely exemplary, so multiplexer 52 is not limited (and thus multiplexers 54, 56, and 58 are not limited) to the description set forth above with reference to FIG. 9.

In accordance with an embodiment of the invention, the shift register comprising an electrical fuse described above with reference to FIGS. 4, 5, 8, and 9 does not require an additional register for input data, so the layout region of the shift register may be smaller than the layout region of a conventional parallel register comprising an electrical fuse.

In addition, referring to FIGS. 4, 5, 8, and 9, shift register 80 comprises a register flip-flop group circuit comprising a plurality of register flip-flops 45, 46, 47, and 48 connected to one another in series, wherein the register flip-flop group circuit is adapted to receive input data and is adapted to shift input data in response to a clock signal CLK. The operation of shift register 80 can be divided into a test mode (i.e., a normal mode) and an electrical fuse mode. Electrical fuses are not used during the test mode, and the test mode is used to test a circuit comprising the shift register before the circuit is supplied to a user.

Register flip-flop 45 corresponds to an output circuit comprising multiplexer 52, and multiplexer 52 receives a register output signal from register flip-flop 45, electrical fuse mode signal fm1, and enable signal Q1_efuse. Register flip-flop 45 also outputs final output signal q1. In the test mode, multiplexer 52 outputs the register output signal received from register flip-flop 45 as final output signal q1. In the electrical fuse mode, multiplexer 52, in response to enable signal Q1_efuse, outputs as final output signal q1 either the register output signal received from register flip-flop 45 or electrical fuse mode signal fm1. The signals that multiplexers 54, 56, and 58 respectively receive and output are analogous to those received and output by multiplexer 52 and are evident from FIG. 4, so further description thereof is omitted here. In addition, the operation of multiplexers 54, 56, and 58 in the test mode is analogous to the operation of multiplexer 52 in the test mode, and the operation of multiplexers 54, 56, and 58 in the electrical fuse mode is analogous to the operation of multiplexer 52 in the electrical fuse mode. Thus, description of the operation of multiplexers 54, 56, and 58 during those modes is omitted here.

Thus, in accordance with an embodiment of the invention, shift register 80, which comprises electrical fuses and is described with reference to FIGS. 4, 5, 8, and 9, in effect merges together a circuit adapted to operate in an electrical fuse mode and a circuit adapted to operate in a test mode. Therefore, a layout area of a shift register in accordance with an embodiment of the invention may be smaller than the layout area of a conventional parallel register comprising an electrical fuse, which requires an additional parallel register for a test mode.

Figure 6:
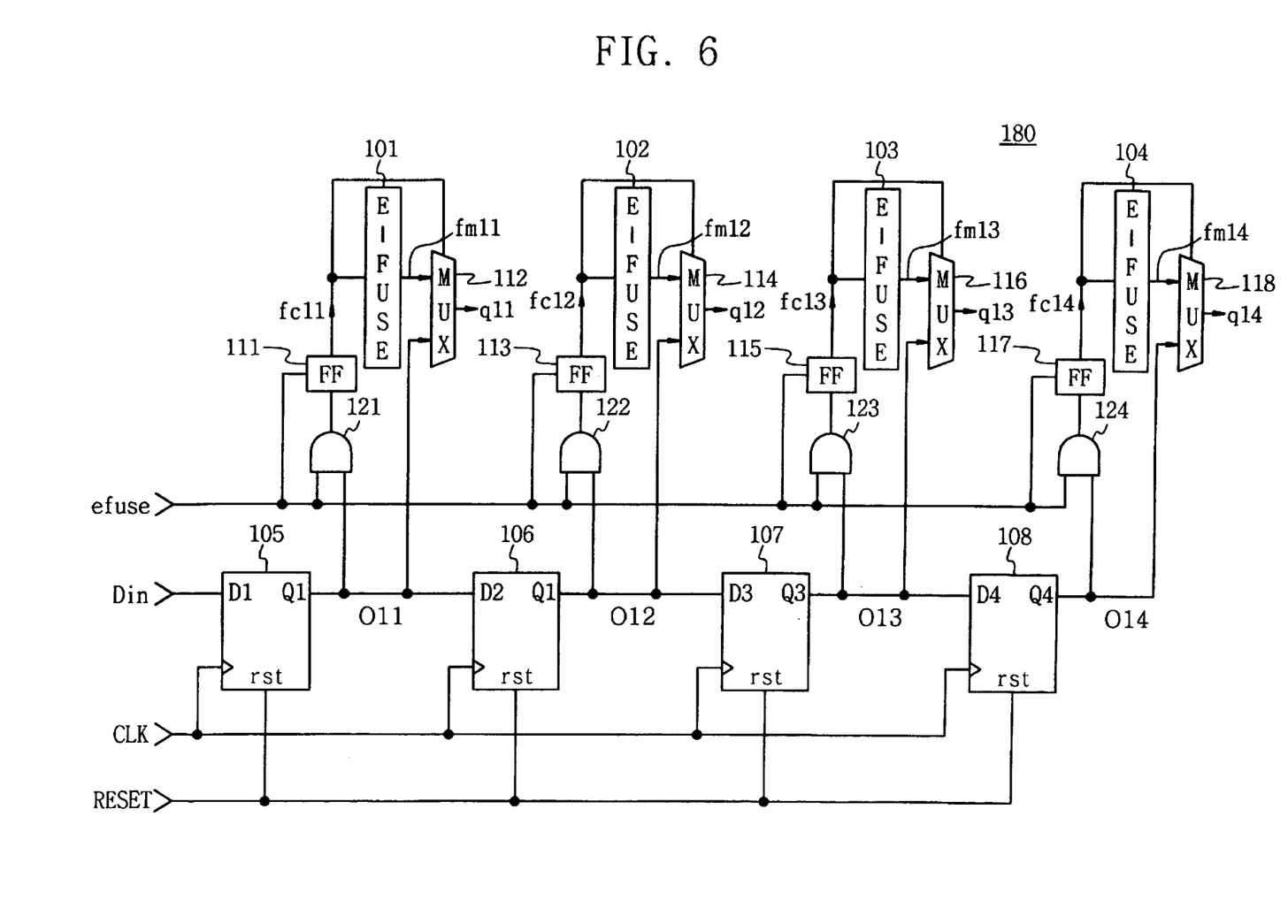
FIG. 6 is a block diagram of shift register comprising an electrical fuse in accordance with another embodiment of the invention.
Figure 7:
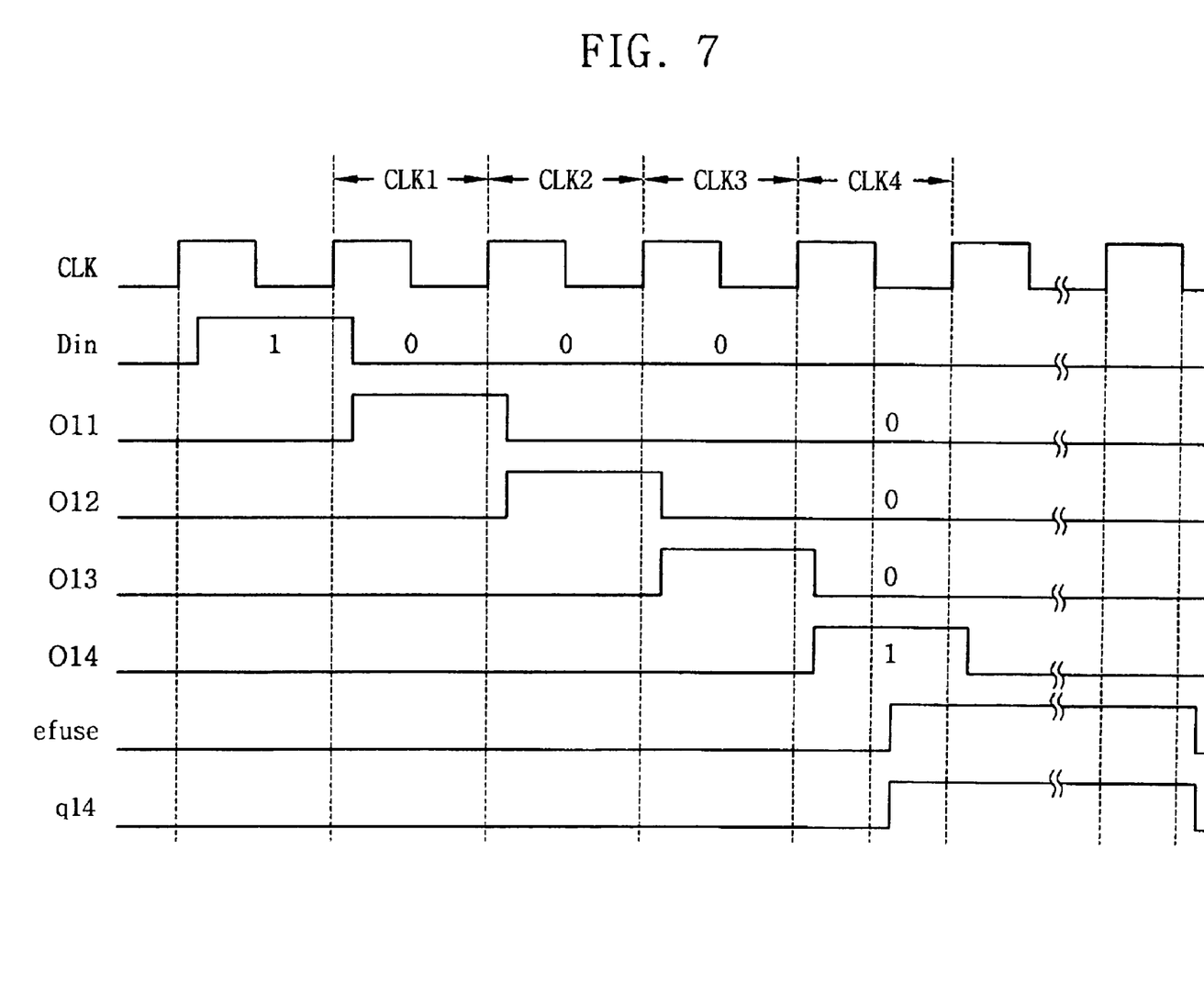
FIG. 7 is a timing diagram illustrating an operation of the shift register illustrated in FIG. 6.

FIG. 6 is a block diagram of a shift register comprising an electrical fuse in accordance with an embodiment of the invention. FIG. 7 is a timing diagram illustrating an operation of the shift register illustrated in FIG. 6.

Referring to FIG. 6, in accordance with an embodiment of the invention, a shift register 180 comprises a register flip-flop group circuit comprising a plurality of register flip-flops 105, 106, 107, and 108 connected to one another in series. The register flip-flop group circuit receives input data signal Din (i.e., register flip-flop 105 receives data signal Din) and then shifts the data in the register flip-flop group circuit in response to a clock signal CLK (i.e., register flip-flops 105, 106, 107, and 108 collectively shift the data). Shift register 180 further comprises a plurality of logic operation units 121, 122, 123, and 124; a plurality of fuse control flip-flops 111, 113, 115, and 117 (each of which is also marked "FF" in the drawings); a plurality of electrical fuses 101, 102, 103, and 104 (each of which is also marked "E-FUSE" in the drawings); and a plurality of multiplexers 112, 114, 116, and 118 (each of which is also marked "MUX" in the drawings). In addition, the logic operation units, fuse control flip-flops, electrical fuses, and multiplexers may be grouped into output circuits such that each output circuit comprises one of the logic operation units, one of the fuse control flip-flops, one of the electrical fuses, and one of the multiplexers, and each output circuit corresponds to one of the register flip-flops. For example, a first output circuit corresponding to register flip-flop 105 comprises logic operation unit 121, fuse control flip-flop 111, electrical fuse 101, and multiplexer 112. Second through fourth output circuits corresponding to register flip-flops 106, 107, and 108, respectively, are analogous to the first output circuit. In addition, each of the first through fourth output circuits receives enable signal efuse (i.e., each of the first through fourth output circuits receives the same enable signal efuse).

Each of register flip-flops 105, 106, 107, and 108 may be a D flip-flop comprising a reset terminal rst that receives a reset signal RESET, and may be reset by reset signal RESET Logic operation units 121, 122, 123, and 124 correspond to register flip-flops 105, 106, 107, and 108, respectively. Each of logic operation units 121, 122, 123, and 124 may be an AND gate. Logic operation units 121, 122, 123, and 124 all receive an enable signal efuse (i.e., logic operation units 121, 122, 123, and 124 all receive the same enable signal efuse). In addition, logic operation units 121, 122, 123, and 124 receive register output signals from register flip-flops 105, 106, 107, and 108, respectively, and each perform a logic operation, and in particular, an AND operation. Logic operation units 121, 122, 123, and 124 output logic operation result signals to fuse control flip-flops 111, 113, 115, and 117, respectively. The operation result signals of logic operation units 121, 122, 123, and 124 correspond to register flip-flops 105, 106, 107, and 108, respectively.

Fuse control flip-flops 111, 113, 115, and 117 correspond to register flip-flops 105, 106, 107, and 108, respectively. In addition, fuse control flip-flops 111, 113, 115, and 117 receive the logic operation result signals of logic operation units 121, 122, 123, and 124, respectively, and then output fuse control signals fc11, fc12, fc13, and fc14, respectively, in response to the enable signal efuse. Output fuse control signals fc11, fc12, fc13, and fc14 correspond to register flip-flops 105, 106, 107, and 108, respectively.

Shift register 180 may be described as comprising a register flip-flop group circuit comprising four register flip-flops (i.e., register flip-flops 105, 106, 107, and 108), and comprising four output circuits, wherein the first through fourth output circuits correspond to register flip-flops 105, 106, 107, and 108, respectively. The configuration and operation of the first output circuit and its corresponding register flip-flop (register flip-flop 105) is substantially the same as the configuration and operation of any of the other output circuits and its corresponding register flip-flop. So, for brevity of explanation, the configuration and operation of only the first output circuit and its corresponding register flip-flop (e.g., register flip-flop 105) will be described in detail.

As mentioned above, the first output circuit of shift register 180 corresponds to register flip-flop 105 of shift register 180, and the first output circuit comprises logic operation unit 121, fuse control flip-flop 111, electrical fuse 101, and multiplexer 112.

Electrical fuse 101 corresponds to register flip-flop 105 and receives fuse control signal fc11 from fuse control flip-flop 111. Electrical fuse 101 is selectively cut in accordance with fuse control signal fc11 and outputs (i.e., generates) an electrical fuse mode signal fm11.

Figure 10:
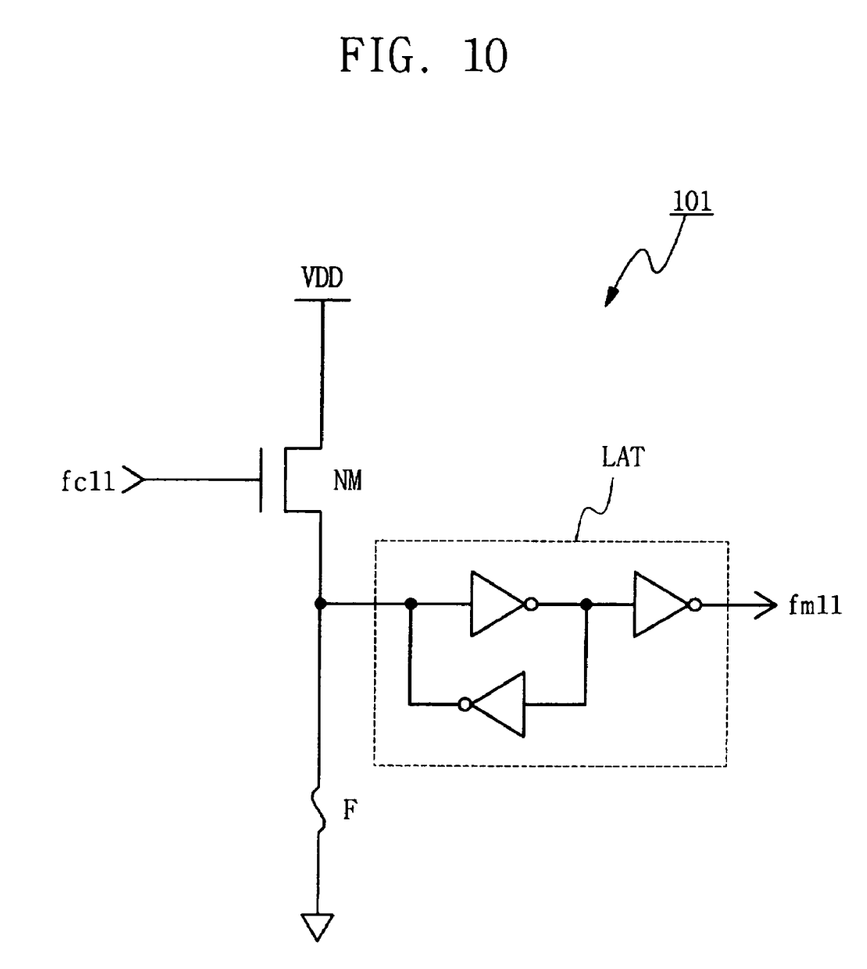
FIG. 10 is a circuit diagram illustrating an electrical fuse of FIG. 6 in accordance with an embodiment of the invention; and, FIG. 11 is a circuit diagram illustrating a multiplexer of FIG. 6 in accordance with an embodiment of the invention.

In the illustrated embodiment, electrical fuse 101 outputs electrical fuse mode signal fm11 when fuse control signal fc11 output by control flip-flop 111 has a logic high level. Control flip-flop 111 corresponds to electrical fuse 101. FIG. 10 is a circuit diagram illustrating an electrical fuse 101 of FIG. 6 in accordance with an embodiment of the invention.

Referring to FIG. 10, electrical fuse 101 comprises an NMOS transistor NM comprising a gate adapted to receive fuse control signal fc11, a drain receiving a power source voltage VDD, and a source that is grounded. In addition, a fuse F is electrically connected between the source of NMOS transistor NM and a ground terminal, and a latch LAT is electrically connected between the source of NMOS transistor NM and an output terminal of electrical fuse 101. In addition, latch LAT outputs an electric fuse mode signal fm11. Respective embodiments of electrical fuses 102, 103, and 104 of FIG. 6 may be substantially the same as the embodiment of electrical fuse 101 illustrated in FIG. 10.

Multiplexer 112 corresponds to register flip-flop 105, receives a register output signal from register flip-flop 105, receives electrical fuse mode signal fm11, and generates a final output signal q11 corresponding to register flip-flop 105. Multiplexer 112 is controlled by fuse control signal fc11 to output as final output signal q11 either the register output signal of register flip-flop 105 or electrical fuse mode signal fm11. In other words, multiplexer 112 selectively outputs electrical fuse mode signal fm11 or the output signal of register flip-flop 105 as final output signal q11 in response to fuse control signal fc11 output from control flip-flop 111 (which corresponds to multiplexer 112). The operation of multiplexer 112 will be described in more detail below with reference to FIG. 11.

An exemplary operation of shift register 180 of FIG. 6 will now be described with reference to FIGS. 6 and 7. In the operation illustrated in FIG. 7, four data values are sequentially input to register flip-flop 105 through input data signal Din. That is, data values 1 (i.e., a logic high level), 0 (i.e., a logic low level), 0, and 0 are sequentially input to register flip-flop 105 through input data signal Din. The register flip-flop group circuit shifts the data input through input data signal Din, so, when the data value 1 that was initially input is apparent at an output node O14, 0's will be apparent at each of output nodes O11, O12, and O13.

Referring to FIGS. 6 and 7, register flip-flop 105 receives and latches input data signal Din and then outputs the latched data to an output terminal Q1 of register flip-flop 105 in response to a first operation cycle CLK1 of clock signal CLK. Output node O11 of register flip-flop 105 is connected (i.e., coupled) to an input terminal D2 of register flip-flop 106, and a signal apparent at output node O11 is applied to input terminal D2 of register flip-flop 106 and latched in register flip-flop 106. Data latched in register flip-flop 106 is then output to an output terminal Q2 of register flip-flop 106 in response to a second operating cycle CLK2 of clock signal CLK. Register flip-flop 107 latches data output by register flip-flop 106 and then outputs the latched data in response to a third operating cycle CLK3 of clock signal CLK. Register flip-flop 108 latches data output by register flip-flop 107 and then outputs the latched data in response to a fourth operating cycle CLK4 of clock signal CLK. Operating cycles CLK1 through CLK4 correspond to consecutive cycles of clock signal CLK. Though the shifting of one data value through each of register flip-flops 105, 106, 107, and 108 was described above, register flip-flops 105, 106, 107, and 108 may collectively shift multiple data values at the same time through the simultaneous operation of register flip-flops 105, 106, 107, and 108 in accordance with clock signal CLK.

Because register flip-flops 105, 106, 107, and 108 may collectively shift multiple data values at the same time, and because of the data values input through input data signal Din, during a fourth operating cycle CLK4, a signal having a logic low level is apparent at each of output nodes O11, O12, and O13, and a signal having a logic high level is apparent at output node O14. Thus, during the fourth operating cycle CLK4, when enable signal efuse having a logic high level is provided to fuse control flip-flop 117, output signal q14 of multiplexer 118 is set to a logic high level. In addition, output signals q11, q12, and q13 corresponding to multiplexers 112, 114, and 116, respectively, are each set to a logic low level.

In the example described above, data values of 1, 0, 0, and 0 are sequentially input into register flip-flop 105 through input data signal Din. However, if the sequence of data values input through input data signal Din are different than the sequence illustrated in FIG. 7, the respective outputs of multiplexers 112, 114, 116, and 118 may be different.

As described above, logic operation unit 121 performs a logic operation on enable signal efuse and the register output signal of register flip-flop 105. When both enable signal efuse and the register output signal of register flip-flop 105 have a logic high level, the fuse of electrical fuse 101 (which corresponds to logic operation unit 121) is cut. However, if the output signal of register flip-flop 105 has a logic low level, logic operation unit 121 outputs a signal having a logic low level regardless of the logic level of enable signal efuse, so the fuse of electrical fuse 101 is not cut.

Figure 11:
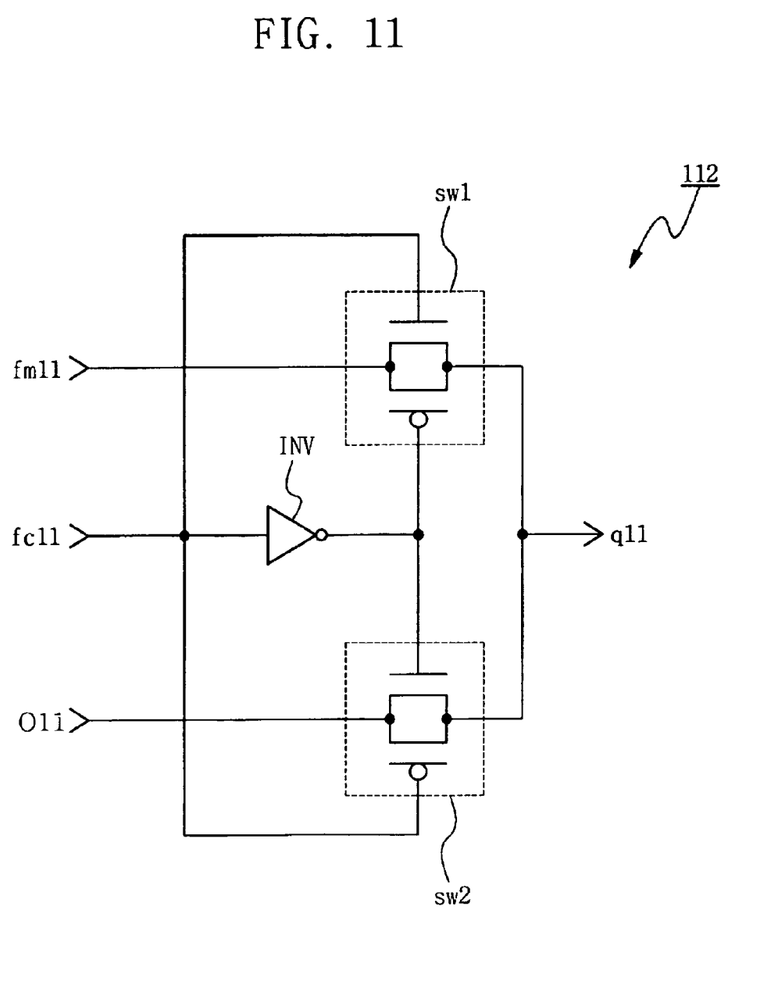

FIG. 11 is a circuit diagram illustrating multiplexer 112 of FIG. 6 in accordance with an embodiment of the invention. Exemplary operations of multiplexer 112 will now be described with reference to FIG. 11.

Referring to FIG. 11, when, for example, fuse control signal fc11 has a logic high level, electrical fuse mode signal fm11 is output as final output signal q11. That is, when fuse control signal fc11 has a logic high level, a switching transistor sw1 is turned ON, so multiplexer 112 outputs electrical fuse mode signal fm11 as final output signal q11. However, when fuse control signal fc11 has a logic low level, a signal apparent at output node O11 of register flip-flop 105 (i.e., the register output signal output by register flip-flop 105) is output as final output signal q11. That is, when fuse control signal fc11 has a logic low level, a switching transistor sw2 is turned ON, so multiplexer 112 outputs a signal apparent at output node O11 of register flip-flop 105 as final output signal q11. Respective embodiments of multiplexers 114, 116, and 118 of FIG. 6 may each be substantially the same as the embodiment of multiplexer 112 illustrated in FIG. 11. However, the structure and operation of multiplexer 112 described above with reference to FIG. 11 is merely exemplary, so multiplexer 112 is not limited (and thus multiplexers 114, 116, and 118 are not limited) to the description set forth above with reference to FIG. 11.

Referring to FIG. 11, multiplexer 112 receives electrical fuse mode signal fm11, a signal apparent at of node O11, and fuse control signal fc11, and outputs final output signal q11. The structure and operation of multiplexers 114, 116, and 118 of FIG. 6 may each be substantially the same as the structure and operation of the embodiment of multiplexer 112 illustrated in FIG. 11.

In accordance with an embodiment of the invention, the shift register comprising an electrical fuse described above with reference to FIGS. 6, 7, 10, and 11 does not require an additional register for input data as compared with the conventional parallel register. Thus, a layout area in shift register 180 may be reduced relative to a conventional parallel register.

In addition, referring to FIGS. 6, 7, 10, and 11, shift register 180 comprises a register flip-flop group circuit comprising a plurality of register flip-flops 105, 106, 107, and 108 connected to one another in series, wherein the register flip-flop group circuit is adapted to receive input data and is adapted to shift input data in response to a clock signal CLK. The operation of shift register 180 can be divided into a test mode and an electrical fuse mode. Electrical fuses are not used during the test mode, and the test mode is used to test a circuit comprising the shift register before the circuit is supplied to a user.

Register flip-flop 105 corresponds to an output circuit comprising multiplexer 112, and multiplexer 112 receives a register output signal from register flip-flop 105, electrical fuse mode signal fm11, and enable signal efuse. Register flip-flop 105 also outputs final output signal q11. In a test mode, multiplexer 112 outputs the register output signal received from register flip-flop 105 as final output signal q11. In the electrical fuse mode, multiplexer 112, in response to enable signal efuse, outputs as final output signal q11 either the register output signal received from register flip-flop 105 or electrical fuse mode signal fm11 (received from electrical fuse 101). The signals that multiplexers 114, 116, and 118 respectively receive and output are analogous to those received and output by multiplexer 112 and are evident from FIG. 6, so further description thereof is omitted here. In addition, the operation of multiplexers 114, 116, and 118 in the test mode is analogous to the operation of multiplexer 112 in the test mode, and the operation of multiplexers 114, 116, and 118 in the electrical fuse mode is analogous to the operation of multiplexer 112 in the electrical fuse mode. Thus, description of the operation of multiplexers 114, 116, and 118 during those modes is omitted here.

Therefore, in accordance with an embodiment of the invention, shift register 180, which comprises electrical fuses and is described wither reference to FIGS. 6, 7, 10, and 11, in effect merges together a circuit adapted to operate in an electrical fuse mode and a circuit adapted to operate in a test mode. Thus, a layout area of a shift register in accordance with an embodiment of the invention may be reduced relative to a conventional parallel register comprising an electrical fuse, which requires an additional parallel register for a test mode.

In addition, the layout area of the embodiment of the shift register illustrated in FIGS. 6, 7, 10, and 11 may be even less than the layout area of the embodiment of the shift register illustrated in FIGS. 4, 5, 8, and 9 because a single enable signal efuse is provided to each of register flip-flops 105, 106, 107, and 108 in the embodiment illustrated in FIGS. 6, 7, 10, and 11, whereas, in the embodiment illustrated in FIGS. 4, 5, 8, and 9, different enable signals Q1_efuse, Q2_efuse, Q3_efuse, and Q4_efuse are provided to register flip-flops 45, 46, 47, and 48, respectively.

A method for operating a shift register, in accordance with an embodiment of the invention, will be described below with reference to FIGS. 6, 7, 10, and 11. As described above, shift register 180 comprises a register flip-flop group circuit comprising a plurality of register flip-flops 105, 106, 107, and 108 connected to one another in series, wherein the register flip-flop group circuit receives input data and is adapted to shift the input data in response to a clock signal CLK. Shift register 180 further comprises a plurality of output circuits that each receive enable signal efuse (i.e., each output circuit receives the same enable signal). As when describing shift fuse 180, when describing the method for operating shift register 180, in accordance with an embodiment of the invention, the method will generally only be described with reference to a first output circuit and its corresponding register flip-flop, which is register flip-flop 105. The first output circuit comprises logic operation unit 121, fuse control flip-flop 111, electrical fuse 101, and multiplexer 112. Shift register 180 further comprises second through fourth output circuits corresponding to register flip-flops 106, 107, and 108, respectively. The operation of the second through fourth output circuits and their corresponding register flip-flops is substantially the same as the operation of the first output circuit and its corresponding register flip-flop, so detailed description of the operation of second through fourth operating circuits using the method will be omitted here.

The method comprises using logic operation unit 121 to perform a logic operation on enable signal efuse and a register output signal output by register flip-flop 105, and then outputting from logic operation unit 121 a logic operation result signal corresponding to the logic operation. In addition, the method comprises fuse control flip-flop 111 outputting a fuse control signal fc11 in response to enable signal efuse, and then selectively cutting electrical fuse 101 in response to fuse control signal fc11. Electrical fuse 101 then outputs an electrical fuse mode signal fm11. The method further comprises multiplexer 112 outputting as a final output signal q11 either the register output signal received from register flip-flop 105 or electrical fuse mode signal fm11 in response to fuse control signal fc11.

Therefore, embodiments of the invention provide a shift register and a method for operating the shift register, wherein the shift register has a smaller layout area than a conventional parallel register and the shift register may also reduce the amount of errors that occur in a final output signal set. Neither the shift register nor the method for operating the shift register requires an additional register for input data as is required in a conventional parallel register comprising an electrical fuse.

In addition, the shift register, in accordance with an embodiment of the invention, does not require an additional parallel register for a test mode, so the shift register may have a smaller layout area than a conventional parallel register comprising an electrical fuse and requiring an additional parallel register for a test mode.

Additionally, a shift register, in accordance with an embodiment of the invention, may reduce the amount of errors that occur in a final output signal set as a result of an electrical fuse being cut during a clock cycle in which the fuse should not be cut.

Although embodiments of the invention have been described herein, modifications may be made to the embodiments by one skilled in the art without departing from the scope of the invention as defined by the accompanying claims.

What is claimed is:

1. A shift register comprising:
a register flip-flop group circuit comprising a plurality of series connection register flip-flops, wherein the register flip-flop group circuit receives input data and shifts the input data in response to a clock signal; and,
a plurality of output circuits respectively receiving a plurality of enable signals, wherein each output circuit comprises:
a fuse control flip-flop receiving a register output signal and one of the plurality of enable signals, wherein the register output signal is output by one of the plurality of register flip-flops and the fuse control flip-flop is adapted to output a fuse control signal in response to the one enable signal;
an electrical fuse receiving the fuse control signal and outputting an electrical fuse mode signal; and,
a multiplexer receiving the register output signal, the electrical fuse mode signal, and the one enable signal, wherein the multiplexer is adapted to output either the register output signal or the electrical fuse mode signal as a final output signal in accordance with the one enable signal.

2. The shift register of claim 1, wherein, in each output circuit, the multiplexer is adapted to output the electrical fuse mode signal as the final output signal when the one enable signal has a logic high level.

3. The shift register of claim 2, wherein, in each output circuit, the multiplexer is adapted to output the register output signal as the final output signal when the one enable signal has a logic low level.

4. The shift register of claim 1, wherein, in each output circuit, the electrical fuse comprises:
an N-type Metal Oxide Semiconductor (NMOS) transistor comprising a gate receiving the fuse control signal, a drain connected to a power source voltage, and a source connected to ground;
a fuse electrically connected between the source of the NMOS transistor and ground;
an output terminal; and,
a latch electrically connected between the source of the NMOS transistor and the output terminal.

5. The shift register of claim 1, wherein, in each output circuit, the fuse control flip-flop is a D flip-flop.

6. The shift register of claim 1, wherein each of the register flip-flops is a D flip-flop comprising a reset terminal receiving a reset signal.

7. A shift register adapted to operate in a test mode and an electrical fuse mode, the shift register comprising:
a register flip-flop group circuit comprising a plurality of series connected register flip-flops, wherein the register flip-flop group circuit receives input data and shifts the input data in response to a clock signal; and,
a plurality of output circuits respectively receiving a plurality of enable signals, wherein each output circuit comprises:
an electrical fuse outputting an electrical fuse mode signal; and,
a multiplexer receiving a register output signal, the electrical fuse mode signal, and one of the plurality of enable signals,
wherein:
the register output signal is output by one of the plurality of register flip-flops;
the multiplexer outputs the register output signal as a final output signal in the test mode; and, the multiplexer outputs the register output signal and the electrical fuse mode signal as the final output signal in response to the one enable signal in the electrical fuse mode.

8. A shift register comprising:
a register flip-flop group circuit comprising a plurality of series connected register flip-flops, wherein the register flip-flop group circuit receives input data and shifts the input data in response to a clock signal; and,
a plurality of output circuits, wherein each output circuit receives an enable signal, wherein the enable signal is the same for each output circuit, and each output circuit comprises:
a logic operation unit receiving the enable signal and a register output signal, wherein the register output signal is output by one of the plurality of register flip-flops and the logic operation unit is adapted to perform a logic operation and output a logic operation result signal;
a fuse control flip-flop receiving the logic operation result signal and outputting a fuse control signal in response to the enable signal;
an electrical fuse receiving the fuse control signal and outputting an electrical fuse mode signal, wherein the electrical fuse is selectively cut in response to the fuse control signal; and,
a multiplexer receiving the register output signal, the electrical fuse mode signal, and the fuse control signal, and adapted to output either the register output signal or the electrical fuse mode signal as the final output signal in response to the fuse control signal.

9. The shift register of claim 8, wherein each register flip-flop is a D flip-flop comprising a reset terminal receiving a reset signal.

10. The shift register of claim 8, wherein, in each output circuit, the logic operation unit is an AND gate.

11. The shift register of claim 8, wherein, in each output circuit, the electrical fuse outputs an electrical fuse mode signal when the fuse control signal has a logic high level.

12. The shift register of claim 11, wherein, in each output circuit, the electrical fuse comprises:
an N-type Metal Oxide Semiconductor (NMOS) transistor comprising a gate receiving the fuse control signal, a drain connected to a power source voltage, and a source connected to ground;
a fuse electrically connected between the source of the NMOS transistor and ground;
an output terminal; and,
a latch electrically connected between the source of the NMOS transistor and the output terminal.

13. A shift register adapted to operate in a test mode and an electrical fuse mode, the shift register comprising:
a register flip-flop group circuit comprising a plurality of series connected register flip-flops, wherein the register flip-flop group circuit receives input data and shifts the input data in response to a clock signal; and,
a plurality of output circuits, wherein each output circuit receives an enable signal, wherein the enable signal is the same for each output circuit, and each output circuit comprises:
an electrical fuse outputting an electrical fuse mode signal; and,
a multiplexer receiving a register output signal, the electrical fuse mode signal, and a fuse control signal, wherein:
the register output signal is output by one of the plurality of register flip-flops;
the multiplexer outputs the register output signal as a final output signal in the test mode, and outputs one of the register output signal and the electrical fuse mode signal as the final output signal in response to the fuse control signal in the electrical fuse mode.

14. The shift register of claim 13, wherein:
each output circuit comprises an AND gate; and,
in each output circuit, the AND gate performs a logic operation on the enable signal and the register output signal.

15. The shift register of claim 14, wherein:
each output circuit comprises a fuse control flip-flop; and,
in each output circuit, the fuse control flip-flop receives a logic operation result signal from the AND gate and outputs the fuse control signal in response to the enable signal.

16. The shift register of claim 15, wherein, in each output circuit, the electrical fuse receives the fuse control signal in the electrical fuse mode.

17. The shift register of claim 13, wherein each of the register flip-flops is a D flip-flop comprising a reset terminal receiving a reset signal.

18. A method of operating a shift register comprising; a register flip-flop group circuit comprising a plurality of series connected register flip-flops, wherein the register flip-flop group circuit receives input data and shifts the input data in response to a clock signal, and a plurality of output circuits, wherein each output circuit receives an enable signal, wherein the enable signal is the same for each output circuit, wherein the method comprises:
performing a logic operation on the enable signal and a register output signal output by one of the register flip-flops;
outputting a logic operation result signal corresponding to the logic operation;
outputting a fuse control signal in response to the enable signal;
selectively cutting an electrical fuse in response to the fuse control signal;
outputting an electrical fuse mode signal; and,
outputting the register output signal or the electrical fuse mode signal as a final output signal in response to the fuse control signal.

* * * * *